US011516584B2

(12) United States Patent
Saito et al.

(10) Patent No.: US 11,516,584 B2
(45) Date of Patent: Nov. 29, 2022

(54) SOUND COLLECTION LOUDSPEAKER APPARATUS, METHOD AND PROGRAM FOR THE SAME

(71) Applicant: NIPPON TELEGRAPH AND TELEPHONE CORPORATION, Tokyo (JP)

(72) Inventors: Shoichiro Saito, Tokyo (JP); Kazunori Kobayashi, Tokyo (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 0 days.

(21) Appl. No.: 17/263,860

(22) PCT Filed: Jul. 10, 2019

(86) PCT No.: PCT/JP2019/027246
§ 371 (c)(1),
(2) Date: Jan. 27, 2021

(87) PCT Pub. No.: WO2020/026726
PCT Pub. Date: Feb. 6, 2020

(65) Prior Publication Data
US 2021/0235191 A1    Jul. 29, 2021

(30) Foreign Application Priority Data
Aug. 2, 2018    (JP) .............................. JP2018-145953

(51) Int. Cl.
H04R 3/12    (2006.01)
H03G 3/30    (2006.01)
(Continued)

(52) U.S. Cl.
CPC ............. *H04R 3/12* (2013.01); *H03G 3/3005* (2013.01); *H04R 1/025* (2013.01); *H04R 1/403* (2013.01);
(Continued)

(58) Field of Classification Search
CPC .......... H04R 3/12; H04R 1/025; H04R 1/403; H04R 1/406; H04R 3/005; H04R 3/02; H04R 2499/13; H04R 2430/01
(Continued)

(56) References Cited

U.S. PATENT DOCUMENTS 8,275,145 B2 *  9/2012  Buck ...................... H04R 27/00
                                                              381/86
8,306,234 B2 * 11/2012  Christoph ........ G10K 11/17875
                                                              381/86
(Continued)

FOREIGN PATENT DOCUMENTS

EP    0509195 A2    10/1992
EP    2615853 A2     7/2013

OTHER PUBLICATIONS

"Technology of 'Intelligent microphone for car'", [online], 2018, Nippon Telegraph and Telephone Corporation, accessed May 24, 2018, Internet, Retrieved from: URL:http://www.ntt.co.jp/news2018/1802/pdf/180219c.pdf, with translation generated by machine.

*Primary Examiner* — Disler Paul

(57) ABSTRACT

Provided is a sound pickup loudspeaker apparatus which suppresses the influence of feedback produced when adding a speaker while also reducing a sense of unnaturalness in a sound image. The sound pickup loudspeaker apparatus collects a target sound emitted from a first seat in the vehicle, plays back the collected target sound to a listener seated in a second seat in the vehicle from a second sound amplifying device disposed in a direction different from the first seat from the perspective of the listener, and furthermore plays
(Continued)

back the collected target sound to the listener from a first sound amplifying device disposed in the same direction as the first seat from the perspective of the listener. The apparatus multiplies the target sound by a first gain and outputs the target sound to the first sound amplifying device; delays the target sound by an amount of time obtained by adding a time for achieving a precedence effect to a delay time of the first sound amplifying device relative to the second sound amplifying device; and multiplies the delayed target sound by a second gain and outputs the target sound to the second sound amplifying device. A first gain adjustment unit adjusts the first gain to a low value and a second gain adjustment unit adjusts the second gain to a high value.

7 Claims, 18 Drawing Sheets

(51) Int. Cl.
    *H04R 1/02*     (2006.01)
    *H04R 1/40*     (2006.01)
    *H04R 3/00*     (2006.01)
    *H04R 3/02*     (2006.01)

(52) U.S. Cl.
    CPC .............. *H04R 1/406* (2013.01); *H04R 3/005* (2013.01); *H04R 3/02* (2013.01); *H03G 2201/103* (2013.01); *H04R 2430/01* (2013.01); *H04R 2499/13* (2013.01)

(58) Field of Classification Search
    USPC .................................. 381/86, 302, 365, 389
    See application file for complete search history.

(56) References Cited

U.S. PATENT DOCUMENTS

| | | | |
|---|---|---|---|
| 9,641,934 B2* | 5/2017 | Herbig | H04R 3/005 |
| 11,348,595 B2* | 5/2022 | Hetherington | G10L 15/20 |
| 2006/0013407 A1 | 1/2006 | Peavey et al. | |
| 2006/0222182 A1 | 10/2006 | Nakaishi et al. | |
| 2018/0242081 A1* | 8/2018 | Every | H04M 9/082 |
| 2020/0213798 A1* | 7/2020 | Morita | H04S 3/002 |

* cited by examiner

SOUND COLLECTION LOUDSPEAKER APPARATUS, METHOD AND PROGRAM FOR THE SAME

CROSS-REFERENCE TO RELATED APPLICATIONS

This application is a U.S. 371 Application of International Patent Application No. PCT/JP2019/027246, filed on 10 Jul. 2019, which application claims priority to and the benefit of JP Application No. 2018-145953, filed on 2 Aug. 2018, the disclosures of which are hereby incorporated herein by reference in their entireties.

TECHNICAL FIELD

The present invention relates to a sound pickup and amplification technique which uses a microphone and a speaker to enable conversations to be had smoothly inside a vehicle.

BACKGROUND ART

Functions known as "in-car communication", "conversation assistance", and the like are increasingly being provided in automobiles (see NON-PATENT LITERATURE 1). Such a function facilitates conversations by collecting the sound of the voice of a person occupying a front seat and playing back that voice to a rear seat. Some such functions also collect audio from the rear seat and play back that audio to the front seat. With in-car communication, speakers 92F and 92R for amplifying the voice of a talker are installed near the ears of a listener sitting in a seat, as illustrated in FIG. 1, which is effective in terms of enabling the voice to be presented at a low volume.

CITATION LIST

Non Patent Literature

[NON-PATENT LITERATURE 1] "Intelligent mic for car no gijutu ni tuite (About 'Intelligent Microphone' Technology for Cars)", [online], 2018, Nippon Telegraph and Telephone Corporation, [May 24, 2018]. Retrieved from <URL:http://www.ntt.co.jp/news2018/1802/pdf/180219c.pdf>

SUMMARY OF THE INVENTION

Technical Problem

However, in the case illustrated in FIG. 1, a person in the rear seat will hear voice from the front seat from behind their head, which produces a sense of unnaturalness in terms of the positional relationship. To eliminate this sense of unnaturalness, the sound image must be brought to the front of the person in the rear seat, and to do so, a method of installing the speaker 92R to the front of that person is conceivable (see FIG. 2). However, this will distance the speaker 92R from the ears of the person in the rear seat, making it necessary to increase the volume of the speaker 92R by that amount, resulting in sound entering a microphone 91R near the rear seat and producing feedback.

It is an object of the present invention to provide a sound pickup loudspeaker apparatus (Hereinafter also referred to as "sound pickup and amplification device"), a method thereof, and a program which suppress the influence of feedback produced when adding a speaker while also reducing a sense of unnaturalness in a sound image.

Means for Solving the Problem

To solve the above-described problem, according to one aspect of the present invention, a sound pickup loudspeaker apparatus is installed in a vehicle. The sound pickup loudspeaker apparatus collects a target sound emitted from a first seat in the vehicle, plays back the collected target sound to a listener seated in a second seat in the vehicle from a second sound amplifying device disposed in a direction different from the first seat from the perspective of the listener, and furthermore plays back the collected target sound to the listener from a first sound amplifying device disposed in the same direction as the first seat from the perspective of the listener. The sound pickup loudspeaker apparatus includes: a first gain adjustment unit that multiplies the target sound by a first gain and outputs the target sound to the first sound amplifying device; a delay unit that delays the target sound by an amount of time obtained by adding a time for achieving a precedence effect to a delay time of the first sound amplifying device relative to the second sound amplifying device, the delay time being obtained from a positional relationship between the first sound amplifying device, the second sound amplifying device, and the listener; and a second gain adjustment unit that multiplies the delayed target sound by a second gain and outputs the target sound to the second sound amplifying device. The first gain adjustment unit adjusts the first gain to a low value and the second gain adjustment unit adjusts the second gain to a high value.

To solve the above-described problem, according to another aspect of the present invention, a sound pickup loudspeaker apparatus is installed in a vehicle. The sound pickup loudspeaker apparatus collects a target sound emitted from a first seat in the vehicle, plays back the collected target sound to a listener seated in a second seat in the vehicle from a second sound amplifying device disposed in a direction different from the first seat from the perspective of the listener, and furthermore plays back the collected target sound to the listener from a first sound amplifying device disposed in the same direction as the first seat from the perspective of the listener. The sound pickup loudspeaker apparatus includes: a first gain adjustment unit that multiplies the target sound by a first gain and outputs the target sound to the first sound amplifying device; a target sound enhancement unit that enhances the target sound from a signal collected by one or more microphones; and a second gain adjustment unit that multiplies the enhanced target sound by a second gain and outputs the target sound to the second sound amplifying device. The target sound that is enhanced has delay relative to the target sound that is not enhanced. The first gain adjustment unit adjusts the first gain to a low value and the second gain adjustment unit adjusts the second gain to a high value.

To solve the above-described problem, according to another aspect of the present invention, a sound pickup loudspeaker apparatus is installed in a vehicle. The vehicle is assumed to have two or more sound pickup and amplification positions, and the apparatus includes: a first microphone disposed in a position where it is easier to collect a sound produced by a first individual located at a first one of the sound pickup and amplification positions than a sound produced by an individual located at another of the sound pickup and amplification positions; a second speaker disposed at a position that reaches a second individual located at a second one of the sound pickup and amplification positions more easily than an individual located at another of the sound pickup and amplification positions, and that is in a direction different from the first individual relative to the second individual; and a first speaker disposed in a direction of the first individual relative to the second individual. The first speaker and the second speaker emit sound produced by the first individual and collected by the first microphone so that the sound emitted from the first speaker reaches an ear of the second individual before the sound emitted from the second speaker.

To solve the above-described problem, according to another aspect of the present invention, a sound pickup loudspeaker apparatus is installed in a vehicle. The sound pickup loudspeaker apparatus: performs control so that an acoustic signal picked up using a microphone that primarily collects sound produced by a first user seated in a first seat in the vehicle is emitted, from a first speaker disposed in a direction of the first seat relative to a second seat in the vehicle, at a strength that does not produce feedback and which enables a second user seated in the second seat to hear the sound; and performs control so that a second speaker, which is disposed in a direction different from the direction of the first seat relative to the second seat and in a position closer to the second seat than the first speaker, begins emitting the acoustic signal after the first speaker begins emitting sound, the second speaker emitting the acoustic signal at a strength which does not produce feedback and which enables the second user to hear the acoustic signal.

Effects of the Invention

The present invention provides an effect in which the influence of feedback produced when adding a speaker can be suppressed while also reducing a sense of unnaturalness in a sound image.

DESCRIPTION OF EMBODIMENTS

Figure 1:
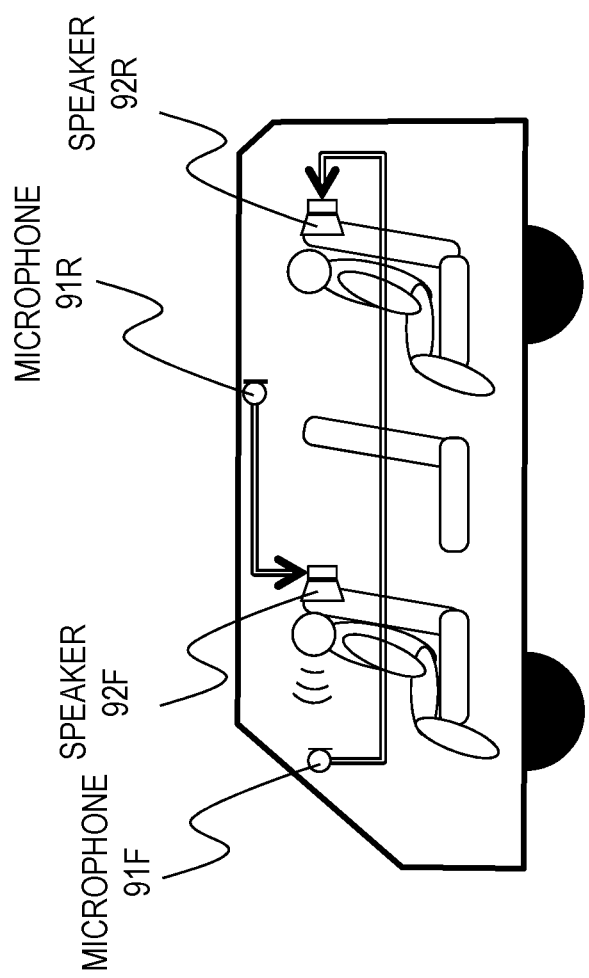
FIG. 1 is a diagram illustrating an example of a layout of microphones and speakers for in-car communication.
Figure 2:
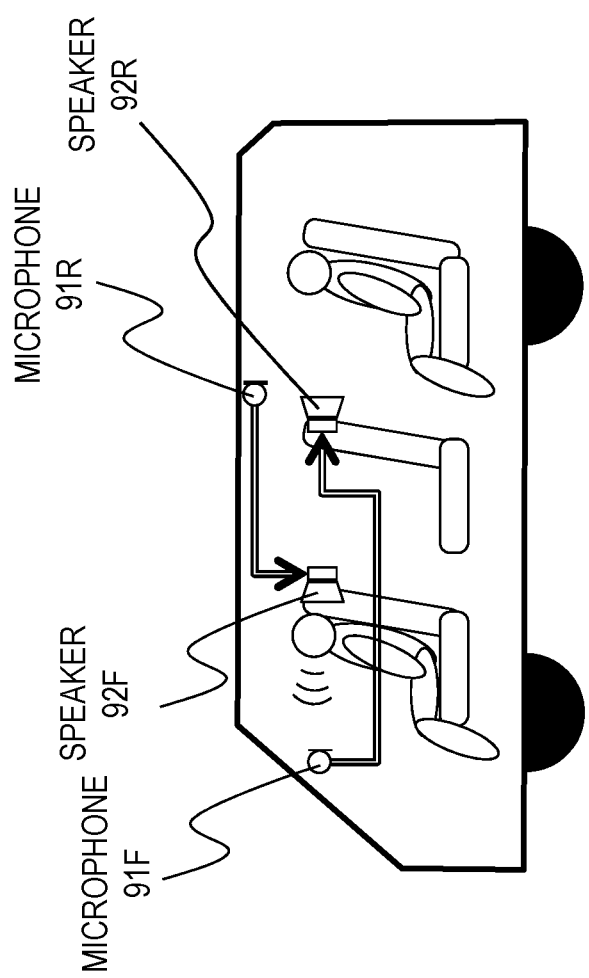
FIG. 2 is a diagram illustrating an example of a layout of microphones and speakers for in-car communication.

Embodiments of the present invention will be described below. In the figures referred to in the following descriptions, constituent elements having the same functions, steps performing the same processing, and the like will be given like reference numerals, and redundant descriptions thereof will not be given. Unless otherwise mentioned, the following descriptions will assume that processing carried out in units of elements of vectors, matrices, and so on is applied to all of those elements of vectors, matrices, and so on.

<Points of the First Embodiment>

The present embodiment uses the precedence effect to produce a sound image in the forward direction (see Reference Document 1).

(Reference Document 1) The Acoustical Society of Japan (ed.), "Spatial Acoustics". Corona, 2010, p. 26-29.

Figure 3:
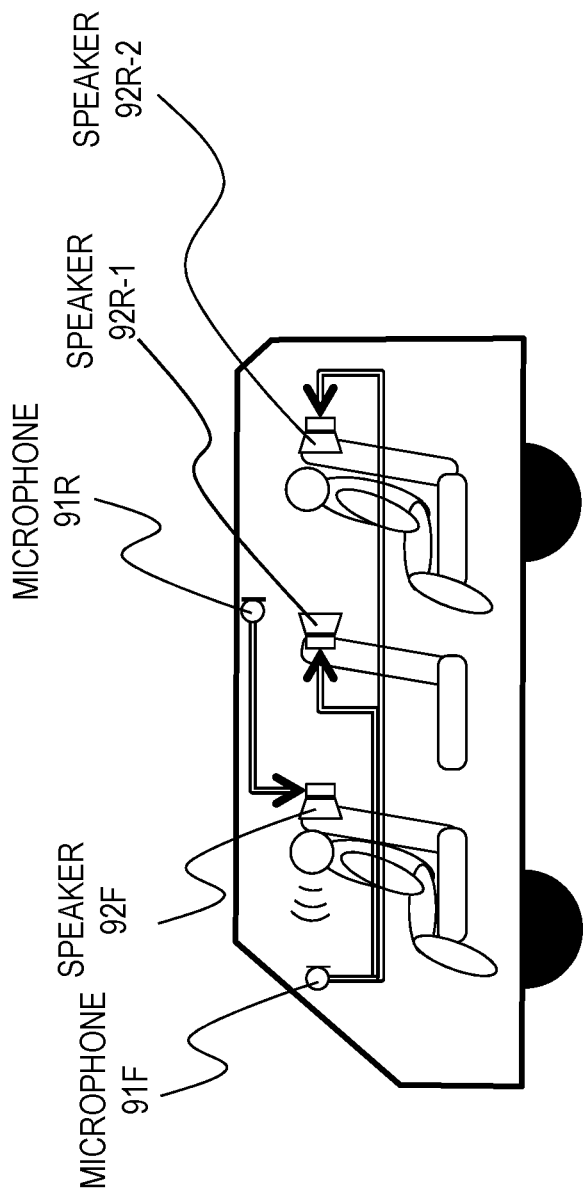
FIG. 3 is a diagram illustrating an example of a layout of microphones and speakers according to a first embodiment.

The "precedence effect" is a phenomenon in which when sounds having the same properties are heard at almost the same time, a sound image will only be perceived in the direction of the sound which is heard first. A configuration for using this effect is as illustrated in FIG. 3. However, simply installing a speaker 92R-1 in order to use the precedence effect does not change the fact that feedback is still likely to arise. Means for adjusting gain so that feedback does not arise will therefore be proposed as well.

First Embodiment

Figure 4:
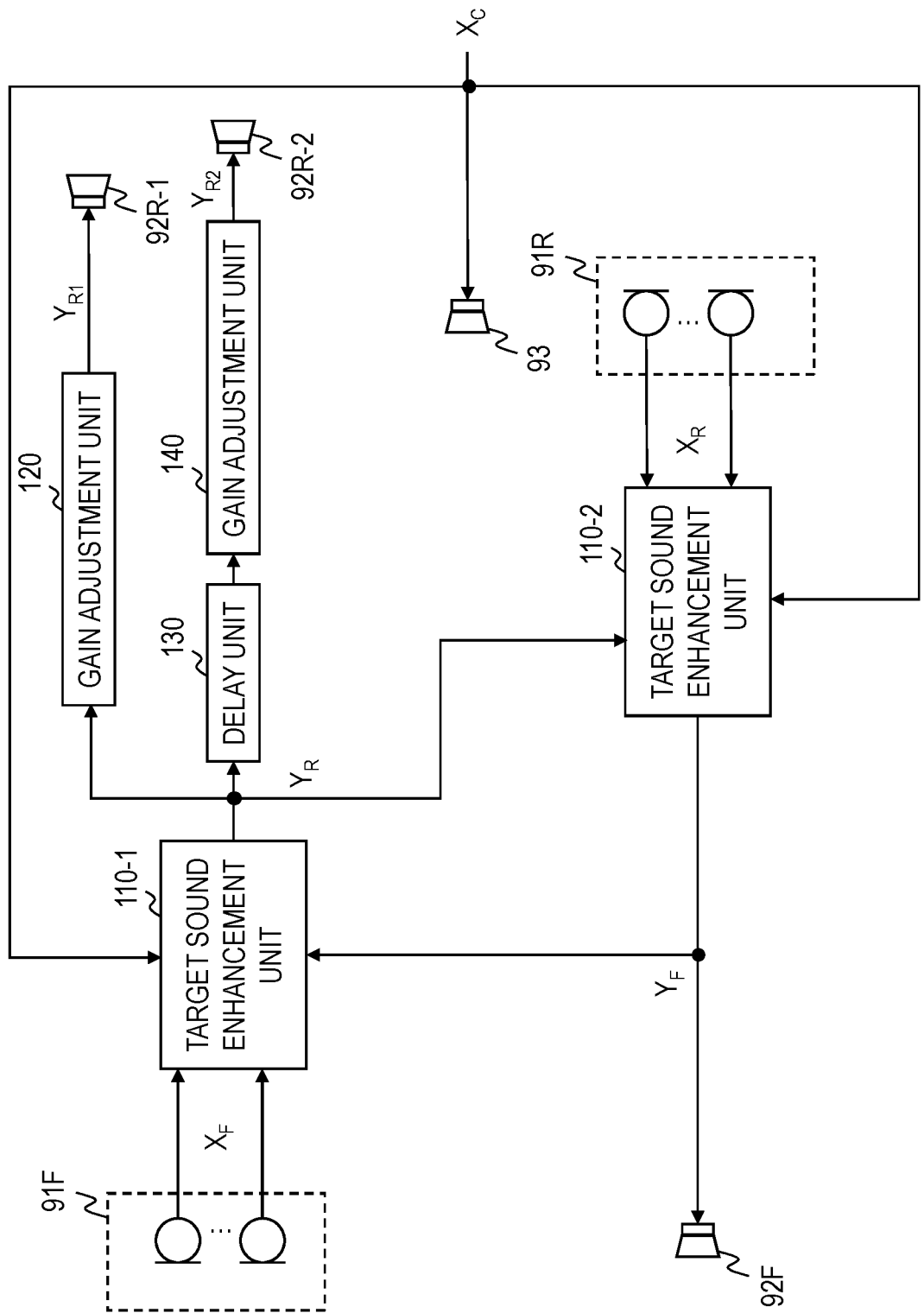
FIG. 4 is a function block diagram illustrating a sound pickup and amplification device according to the first embodiment.
Figure 5:
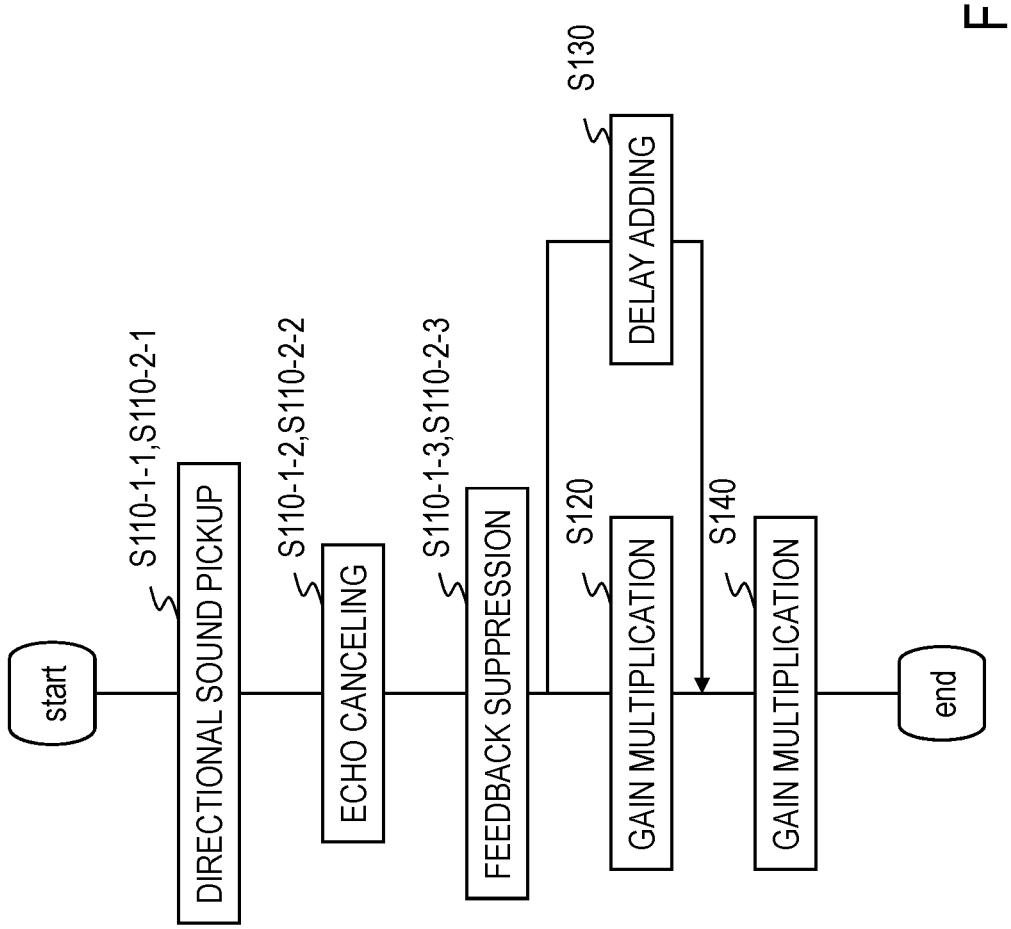
FIG. 5 is a diagram illustrating an example of a flow of processing by the sound pickup and amplification device according to the first embodiment.

FIG. 4 is a function block diagram illustrating a sound pickup and amplification device according to the first embodiment, and FIG. 5 illustrates a processing flow thereof.

The sound pickup and amplification device includes target sound enhancement units 110-1 and 110-2, a delay unit 130, and gain adjustment units 120 and 140.

In the present embodiment, a vehicle in which the sound pickup and amplification device is installed has the structure illustrated in FIG. 3, with three rows of seats. Furthermore, the vehicle according to the present embodiment includes a microphone 91F which collects sound mainly of the voice of a talker in the first row, and a microphone 91R which collects sound mainly of the voice of a talker in the third row. Each of the microphones 91F and 91R is constituted by M microphones. Note that F and R indicate "front" and "rear", respectively, with respect to a travel direction of the vehicle. Furthermore, the vehicle according to the present embodiment includes a speaker 92F that plays back sound to a listener in a seat in the first row, and speakers 92R-1 and 92R-2 that play back sound to a listener in a seat in the third row. The speaker 92R-1 is disposed in the same direction as the seat in the first row from the perspective of the listener sitting in a seat in the third row (i.e., to the front), whereas the speaker 92R-2 is disposed in a different direction from the seat in the first row from the perspective of the listener sitting in the seat in the third row (i.e., to the rear). Note that "the same direction" does not mean the exact same direction, but rather means a direction in which a sense of unnaturalness is unlikely to arise with respect to the sound image. Likewise, a "different direction" means a direction in which a sense of unnaturalness is likely to arise with respect to the sound image. Each of the speakers 92F, 92R-1, and 92R-2 is constituted by N speakers. Note that N is any integer greater than or equal to 1, and represents the number of channels in a playback signal.

The sound pickup and amplification device takes, as inputs, sound pickup signals $X_F=[X_{F,1}, \ldots, X_{F,M}]$ and $X_R=[X_{R,1}, \ldots, X_{R,M}]$ obtained by collecting sound using the two microphones 91F and 91R installed in the vehicle and a playback signal (e.g., an audio signal) $X_C=[X_{C,1}, \ldots, X_{C,S}]$ played back by a speaker 93 of an onboard acoustic device (e.g., a car audio system), and generates and outputs playback Signals $Y_F=[Y_{F,1}, \ldots, Y_{F,N}]$, $Y_{R1}=[Y_{R1,1}, \ldots, Y_{R1,N}]$, and $Y_{R2}=[Y_{R2,1}, \ldots, Y_{R2,N}]$, which are played back by the three speakers 92F, 92R-1, and 92R-2 installed within the vehicle. Note that S represents the number of channels in the playback signal played back by the speaker 93 of the onboard acoustic device.

The sound pickup and amplification device is a special device configured by loading a special program into a known or dedicated computer including, for example, a central processing unit (CPU), a main storage device (RAM: Random Access Memory), and the like. The sound pickup and amplification device executes various types of processing under the control of the central processing unit, for example. Data input to the sound pickup and amplification device, data obtained from the various types of processing, and so on is, for example, stored in the main storage device, and the data stored in the main storage device is read out to the central processing unit and used in other processing as necessary. The various processing units of the sound pickup and amplification device may be at least partially constituted by hardware such as integrated circuits. The various storage units provided in the sound pickup and amplification device can, for example, be constituted by the main storage device such as RAM (Random Access Memory), or by middleware such as relational databases or key value stores. However, it is not absolutely necessary for the storage units to be provided within the sound pickup and amplification device; the units may be constituted by an auxiliary storage device including a hard disk, an optical disc, or a semiconductor memory element such as flash memory, and provided outside the sound pickup and amplification device.

Each unit will be described hereinafter.

<Target Sound Enhancement Unit 110-1>

A target sound enhancement unit 110-1 takes, as inputs, the sound pickup signal $X_F=[X_{F,1}, \ldots, X_{F,M}]$ in which the voice mainly of a talker in the first row has been collected by the microphone 91F, the playback signal $Y_F=[Y_{F,1}, \ldots, Y_{F,N}]$ generated by a target sound enhancement unit 110-2 and played back by the speaker 92F for the seat in the first row, and the playback signal $X_C=[X_{C,1}, \ldots, X_{C,S}]$ played back by the speaker 93 of the onboard acoustic device. The target sound enhancement unit 110-1 finds a playback signal $Y_R=[Y_{R,1}, \ldots, Y_{R,N}]$ in which a target sound (a sound emitted from the seat in front) has been enhanced from the sound pickup signal $X_F$, and outputs the playback signal $Y_R$ which has been found.

Figure 6:
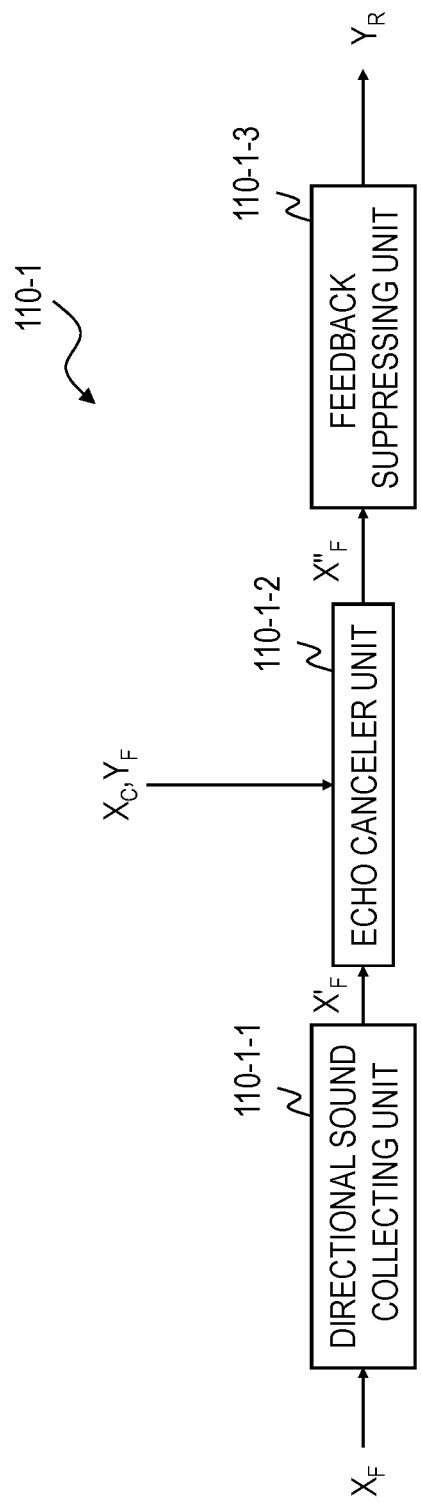
FIG. 6 is a function block diagram illustrating a target sound enhancement unit according to the first embodiment.

FIG. 6 is a function block diagram illustrating the target sound enhancement unit 110-1.

The target sound enhancement unit 110-1 includes a directional sound collecting unit 110-1-1, an echo canceler unit 110-1-2, and a feedback suppressing unit 110-1-3. Each unit will be described hereinafter.

(Directional Sound Collecting Unit 110-1-1)

The directional sound collecting unit 110-1-1 takes the sound pickup signal $X_F=[X_{F,1}, \ldots, X_{F,M}]$, as an input, and finds an enhanced signal $X'_F$ (S110-1-1) in which the target sound (a sound emitted from the seat in front) has been enhanced from the sound pickup signal $X_F=[X_{F,1}, \ldots, X_{F,M}]$, and outputs the enhanced signal $X'_F$.

Note that the enhanced signal may be found through any method. For example, an enhancement technique disclosed in Japanese Patent Application Publication No. 2004-078021 can be used.

(Echo Canceler Unit 110-1-2)

The echo canceler unit 110-1-2 takes the enhanced signal $X'_F$, the playback signal $Y_F$, and the playback signal $X_C$ as inputs. Then, by removing a sound component played back by the speaker 93, a sound component played back by the speaker 92F, and so on contained in the enhanced signal $X'_F$, the echo canceler unit 110-1-2 finds an enhanced signal $X''_F$ in which an echo component has been removed (S110-1-2) and outputs that enhanced signal $X''_F$.

Figure 7:
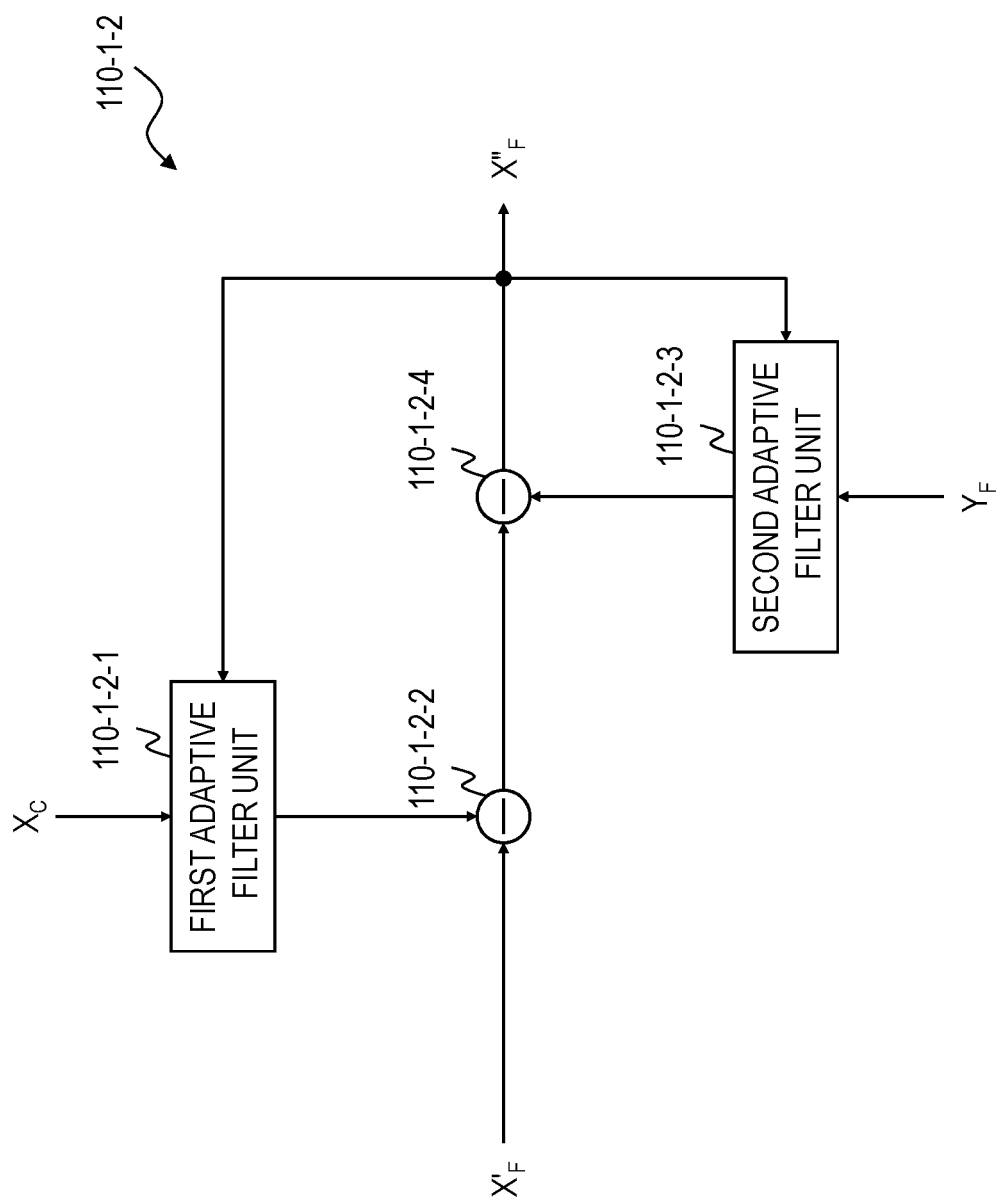
FIG. 7 is a function block diagram illustrating an echo canceler unit according to the first embodiment.

FIG. 7 is a function block diagram illustrating the echo canceler unit 110-1-2.

The echo canceler unit 110-1-2 includes a first adaptive filter unit 110-1-2-1, a first subtracting unit 110-1-2-2, a second adaptive filter unit 110-1-2-3, and a second subtracting unit 110-1-2-4.

The first adaptive filter unit 110-1-2-1 takes the playback signal $X_C$ as an input, filters the playback signal $X_C$ using a first adaptive filter, and generates and outputs a first pseudo-echo $Y_1$.

The first subtracting unit 110-1-2-2 takes the enhanced signal $X'_F$ and the first pseudo-echo $Y_1$ as inputs, subtracts the first pseudo-echo $Y_1$ from the enhanced signal $X'_F$, and obtains and outputs an enhanced signal $X'_{F,1}$. Note that the subtraction may be carried out individually from each of the channels, or collectively from a sum of all of the channels. For example, first pseudo-echoes $Y_{1,n}$ in N channels, obtained by filtering playback signals $X_{C,n}$ (n=1, 2, ..., N) in N channels (where $Y_1=[Y_{1,1}, \ldots, Y_{1,N}]$), may be subtracted from the enhanced signal $X'_F$ individually, or the sum of the first pseudo-echoes $Y_{1,n}$ in N channels may be subtracted from the enhanced signal $X'_F$.

The second adaptive filter unit 110-1-2-3 takes the playback signal $Y_F$ as an input, filters the playback signal $Y_F$ using a second adaptive filter, and generates and outputs a second pseudo-echo $Y_2$.

The second subtracting unit 110-1-2-4 takes the enhanced signal $X'_{F,1}$ and the second pseudo-echo $Y_2$ as inputs, subtracts the second pseudo-echo $Y_2$ from the enhanced signal $X'_{F,1}$, and obtains and outputs an enhanced signal $X''_F$. Like the first subtracting unit 110-1-2-2, the subtraction may be carried out individually from each of the channels, or collectively from a sum of all of the channels.

Furthermore, the first adaptive filter unit 110-1-2-1 takes the enhanced signal $X''_F$ in which the echo component has been removed (corresponding to an error signal) as an input, and updates the first adaptive filter using the playback signal $X_C$ and the enhanced signal $X''_F$. Likewise, the second adaptive filter unit 110-1-2-3 takes the enhanced signal $X''_F$ as an input, and updates the second adaptive filter using the playback signal $Y_F$ and the enhanced signal $X''_F$.

A variety of methods can be used as methods for updating the adaptive filters. For example, the filters may be updated using an NLMS algorithm or the like, as disclosed in Reference Document 2.

(Reference Document 2) Ohga, J., Yamazaki, Y., and Kaneda, Y., "Onkyou Sisutemu to Dijitaru Syori (Acoustic Systems and Digital Processing)", Institute of Electronics, Information and Communication Engineers (ed.), Corona, 1995, p 140, 141

Note also that the echo removal method is not limited to that described above, and the echo component may be removed through any method. For example, an echo removal technique disclosed in Japanese Patent Application Publication No. 2010-187086 can be used.

(Feedback Suppressing Unit 110-1-3)

The feedback suppressing unit 110-1-3 takes the enhanced signal $X''_F$ as an input, suppresses a feedback component (S110-1-3), and outputs a post-feedback suppression signal as the playback signal $Y_R$.

Note that the feedback component may be suppressed through any method. For example, a feedback suppression technique disclosed in Japanese Patent Application Publication No. 2007-221219 can be used.

<Target Sound Enhancement Unit 110-2>

The target sound enhancement unit 110-2 takes, as inputs, a sound pickup signal $X_R=[X_{R,1}, \ldots, X_{R,M}]$ in which the voice mainly of a talker in the third row has been collected by the microphone 91R, the playback signal $Y_R=[Y_{R,1}, \ldots, Y_{R,N}]$, and the playback signal $X_C=[X_{C,1}, \ldots, X_{C,S}]$. The target sound enhancement unit 110-2 finds the playback signal $Y_F=[Y_{F,1}, \ldots, Y_{F,N}]$ in which a target sound (a sound emitted from the seat in the rear) has been enhanced from the sound pickup signal $X_R=[X_{F,1}, \ldots, X_{F,M}]$, and outputs the $Y_F$ which has been found.

Figure 8:
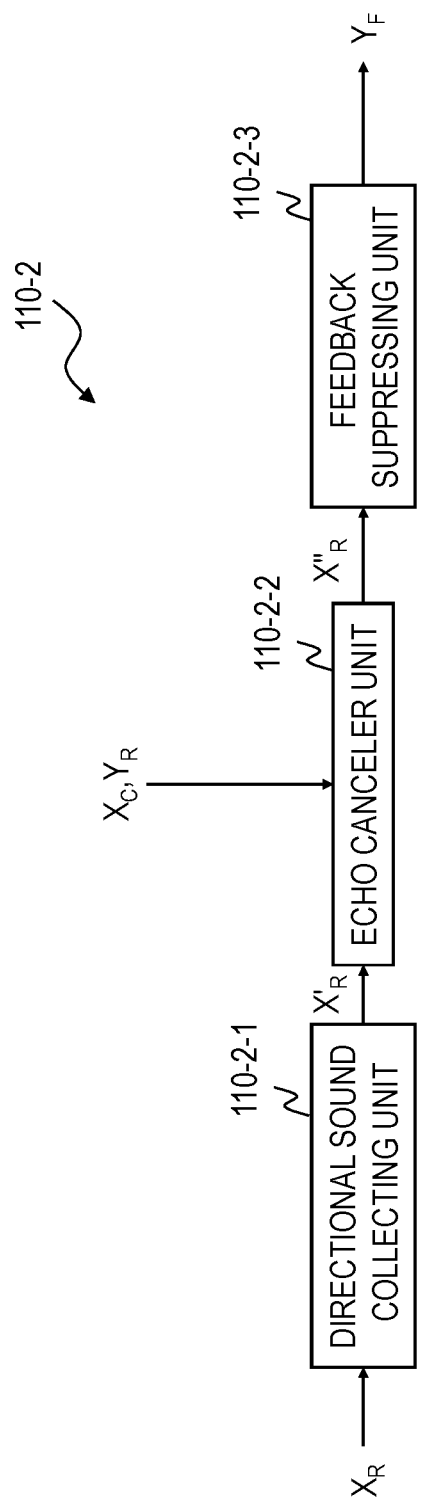
FIG. 8 is a function block diagram illustrating the target sound enhancement unit according to the first embodiment.

FIG. 8 is a function block diagram illustrating the target sound enhancement unit 110-2.

The target sound enhancement unit 110-2 includes a directional sound collecting unit 110-2-1, an echo canceler unit 110-2-2, and a feedback suppressing unit 110-2-3. Each unit will be described hereinafter.

(Directional Sound Collecting Unit 110-2-1)

The directional sound collecting unit 110-2-1 takes the sound pickup signal $X_R=[X_{R,1}, \ldots, X_{R,M}]$ as an input, and finds an enhanced signal $X'_R$ (S110-2-1) in which the target sound (a sound emitted from the seat in the rear) has been enhanced from the sound pickup signal $X_R=[X_{R,1}, \ldots, X_{R,M}]$, and outputs the enhanced signal $X'_R$. The enhanced signal may be found through the same method as that used by the directional sound collecting unit 110-1-1.

(Echo Canceler Unit 110-2-2)

The echo canceler unit 110-2-2 takes the enhanced signal $X'_R$, the playback signal $Y_R=[Y_{R,1}, \ldots, Y_{R,N}]$, and the playback signal $X_C$ as inputs. Then, by removing a sound component played back by the speaker 93, a sound component played back by the speakers 92R-1 and 92R-2, and so on contained in the enhanced signal $X'_R$, the echo canceler unit 110-2-2 finds an enhanced signal $X''_R$ in which an echo component has been removed (S110-2-2) and outputs that enhanced signal $X''_R$.

Figure 9:
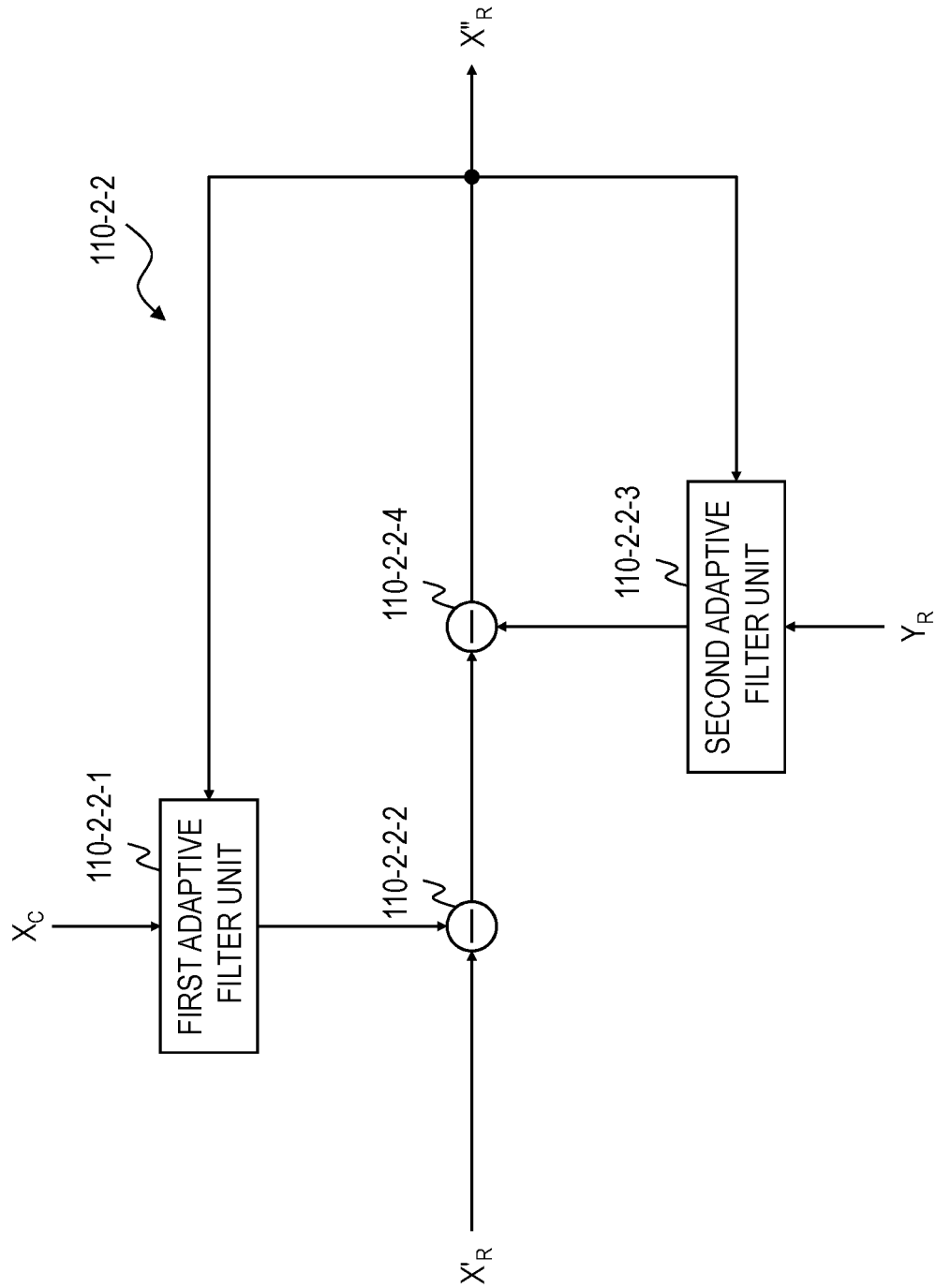
FIG. 9 is a function block diagram illustrating the echo canceler unit according to the first embodiment.

FIG. 9 is a function block diagram illustrating the echo canceler unit 110-2-2.

The echo canceler unit 110-2-2 includes a first adaptive filter unit 110-2-2-1, a first subtracting unit 110-2-2-2, a second adaptive filter unit 110-2-2-3, and a second subtracting unit 110-2-2-4.

The first adaptive filter unit 110-2-2-1 takes the playback signal $X_C$ as an input, filters the playback signal $X_C$ using a first adaptive filter, and generates and outputs a first pseudo-echo $Y'_1$.

The first subtracting unit 110-2-2-2 takes the enhanced signal $X'_R$ and the first pseudo-echo $Y'_1$ as inputs, subtracts the first pseudo-echo $Y'_1$ from the enhanced signal $X'_R$, and obtains and outputs an enhanced signal $X'_{R,1}$.

The second adaptive filter unit 110-2-2-3 takes the playback signal $Y_R$ as an input, filters the playback signal $Y_R$ using a second adaptive filter, and generates and outputs a second pseudo-echo $Y'_2$.

The second subtracting unit 110-2-2-4 takes the enhanced signal $X'_{R,1}$ and the second pseudo-echo $Y'_2$ as inputs, subtracts the second pseudo-echo $Y'_2$ from the enhanced signal $X'_{R,1}$, and obtains and outputs an enhanced signal $X''_R$.

Furthermore, the first adaptive filter unit 110-2-2-1 takes the enhanced signal $X''_R$ in which the echo component has been removed (corresponding to an error signal) as an input, and updates the first adaptive filter using the playback signal $X_C$ and the enhanced signal $X''_R$. Likewise, the second adaptive filter unit 110-2-2-3 takes the enhanced signal $X''_R$ as an input, and updates the second adaptive filter using the playback signal $Y_R$ and the enhanced signal $X''_R$. The adaptive filters may be updated through the same method as that used for the first adaptive filter unit 110-1-2-1 and the like.

(Feedback Suppressing Unit 110-2-3)

The feedback suppressing unit 110-2-3 takes the enhanced signal $X''_R$ as an input, suppresses a feedback component (S110-2-3), and outputs a post-feedback suppression signal as the playback signal $Y_F$. The feedback component may be suppressed through the same method as that used for the feedback suppressing unit 110-1-3.

<Delay Unit 130>

The delay unit 130 takes the playback signal $Y_R=[Y_{R,1}, \ldots, Y_{R,N}]$ as an input, and delays the playback signal $Y_R=[Y_{R,1}, \ldots, Y_{R,N}]$ (S130) by an amount of time equivalent to adding a time required for achieving the precedence effect to a delay time of the speaker 92R-1 relative to the speaker 92R-2, the delay time being obtained from a positional relationship between the speakers 92R-1 and 92R-2 and the listener sitting in the rear seat; a delayed playback signal $Y'_R$. When a playback signal input at a given time t is represented by $Y_R(t)$, the delayed playback signal $Y'_R(t)$ is found through the following equation.

$$Y'_R(t)=Y_R(t-\delta)$$

Figure 10:
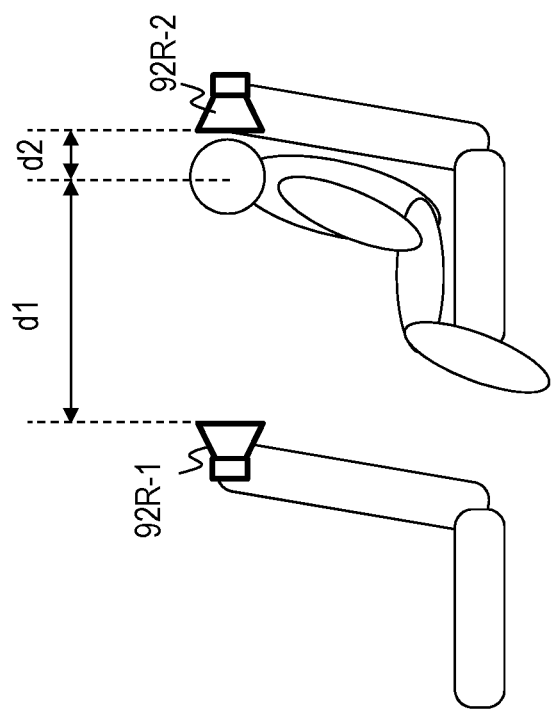
FIG. 10 is a diagram illustrating a positional relationship between speakers and a listener seated in a rear seat.

A value $\delta$ of the delay is calculated from the positional relationship between the speakers 92R-1 and 92R-2 and the listener sitting in the rear seat. Assuming a positional relationship such as that illustrated in FIG. 10, this is calculated as $\delta=(d1-d2)/v+\delta_0$. v represents an acoustic velocity. The first term is for compensating for delay involved in air propagation, and the second term is the delay for the precedence effect. It is known that with the precedence effect, a sound image will be perceived in the direction of a preceding sound if a following sound is delayed by approximately 1 ms, and thus $\delta_0$ is a value of approximately 1 ms to 2 ms.

<Gain Adjustment Units 120 and 140>

The gain adjustment unit 120 takes the playback signal $Y_R=[Y_{R,1}, \ldots, Y_{R,N}]$ as an input, multiplies that signal by a gain $\alpha_1$ (S120), and outputs the result. The speaker 92R-1 plays back a playback signal $Y_{R1}$ ($=\alpha_1 Y_R$) multiplied by the gain $\alpha_1$.

The gain adjustment unit 140 takes the delayed playback signal $Y'_R = [Y'_{R,1}, \ldots, Y'_{R,N}]$ as an input, multiplies that signal by a gain $\alpha_2$ (S140), and outputs the result. The speaker 92R-2 plays back a playback signal $Y_{R2}$ ($=\alpha_2 Y'_R$) multiplied by the gain $\alpha_2$.

Note that the gain adjustment unit 120 adjusts the gain $\alpha_1$ to a low value. The gain adjustment unit 140 adjusts the gain $\alpha_2$ to a high value. The speaker 92R-1 for the precedence effect only needs to be at a volume which extends the orientation of the sound. As such, the volume of the speaker 92R-1 need not be such a high volume that the content of the sound can be understood, and a volume that is "easy to hear" is realized by the speaker 92R-2 located near the listening position. Of course, the louder the preceding sound is, the easier it is to hear the sound, but the speaker 92R-1 is far from the listening position, and thus keeping the volume thereof lower increases the effect of suppressing feedback. Here, the speaker 92R-1 being "far from the listening position" refers to the speaker 92R-1 being relatively closer to the microphone 91R than the speaker 92R-2, which is located nearer the listening position. An adjustment method will be described next.

(1) First, the gain adjustment unit 140 sets the gain to mute (gain $\alpha_2=0$). The gain adjustment unit 120 then changes the gain $\alpha_1$, multiplies a target sound for adjustment by the gain $\alpha_1$, and plays back the result from the speaker 92R-1. When the minimum gain at which a person in the rear seat can hear an amplified voice is represented by $\alpha_{1L}$ and the maximum gain of a range in which feedback does not arise is represented by $\alpha_{1H}$, the gain adjustment unit 120 sets the gain as $\alpha_1 = \min(\alpha_{1L} \cdot \beta_{1L}, \alpha_{1H} \cdot \beta_{1H})$. min ( ) represents a function that returns a minimum value. $\beta_{1L}$ and $\beta_{1H}$ are margin values. $\beta_{1L}$ is an amount which provides a margin for a volume at which the voice can be heard even when noise arises (even when travel noise or the like is picked up). $\beta_{1L}$ is, for example, +6 dB ($\beta_{1L}=2.0$) or the like. $\beta_{1H}$ is a feedback margin for making adjustments so that feedback does not arise even when noise arises (due to environmental noise or the like). $\beta_{1H}$ is, for example, −6 dB ($\beta_{1H}=0.5$) or the like. With such a configuration, (i) sound is output at the minimum volume needed to be able to hear the sound (aimed only at the effect of the preceding sound), and (ii) the volume is not raised beyond a prescribed upper limit in order to prevent feedback.

(2) Next, the gain adjustment unit 120 sets the gain to mute (gain $\alpha_1=0$). The gain adjustment unit 140 then changes the gain $\alpha_2$, multiplies the target sound for adjustment by the gain $\alpha_2$, and plays back the result from the speaker 92R-2. When the minimum gain at which a person in the rear seat can hear an amplified voice is represented by $\alpha_{2L}$ and the maximum gain of a range in which feedback does not arise is represented by $\alpha_{2H}$, the gain adjustment unit 140 sets the gain as $\alpha_2 = \min(\alpha_{2L} \cdot \beta_{2L}, \alpha_{2H} \cdot \beta_{2H})$. $\beta_{2L}$ and $\beta_{2H}$ are margin values. $\beta_{2L}$ is an amount which provides a margin for a volume at which the voice can be heard even when noise arises (even when travel noise or the like is picked up). $\beta_{2L}$ is, for example, +6 dB ($\beta_{2L}=2.0$) or the like. $\beta_{2H}$ is a feedback margin for making adjustments so that feedback does not arise even when noise arises (due to environmental noise or the like). $\beta_{2H}$ is, for example, −6 dB ($\beta_{2H}=0.5$) or the like. Note that $\beta_{2L}$ is set to a higher value (at which feedback still does not arise) than $\beta_{1L}$ in the aforementioned (1). This differs from (1) in that $\alpha_1$ reduces the gain as much as possible, while $\alpha_2$ increases the gain as much as possible. Through such a configuration, the volume can be increased within a range at which feedback does not arise.

(3) It is then checked whether feedback arises when both $\alpha_1$ and $\alpha_2$ found through the aforementioned (1) and (2) are on. In other words, the target sound for adjustment is played back from the speakers 92R-1 and 92R-2 using $\alpha_1$ and $\alpha_2$, and it is checked whether feedback arises. If feedback arises, $\beta_{1H}$ and $\beta_{2H}$ are multiplied by a prescribed value $\gamma$ that is greater than 0 and less than 1 (e.g., −3 dB, $\gamma=0.70$), and using new margins $\beta_{1H} \leftarrow \gamma \beta_{1H}$ and $\beta_{2H} \leftarrow \gamma \beta_{2H}$, $\alpha_1$ and $\alpha_2$ are adjusted repeatedly until the feedback no longer arises. There are cases where $\alpha_1$ and $\alpha_2$ are set so as to satisfy both of the aforementioned (1) and (2), and if added together (i.e., if two playback signals are played back simultaneously), feedback will arise. The configuration of (3) makes it possible to prevent feedback arises when two playback signals are played back simultaneously as well.

Note that the adjustment of the gain $\alpha_1$ and $\alpha_2$ is carried out before processing for collecting and amplifying sound.

Effects

According to the configuration described above, an effect in which the influence of feedback produced when adding a speaker can be suppressed while also reducing a sense of unnaturalness in a sound image by using the precedence effect.

The precedence effect occurs even when the sound which is heard later is as loud as 10 dB. Accordingly, first, the target sound is played back by the speaker 92R-1 installed to the front of the rear seat at a low volume (a volume at which a person in the rear seat can hear the amplified voice). On the other hand, the target sound is played back from the speaker 92R-2 installed to the rear of the rear seat at a high volume (but a volume at which feedback will not arise), with delay that can produce the precedence effect added thereto. The target sound is played back at a low volume from the speaker 92R-1 located near the microphone 91R, which makes it easy to suppress feedback. On the other hand, the target sound is played back at a higher volume (a volume which is easy to hear) from the speaker 92R-2 further from the microphone 91R, and thus a listener sitting in the rear seat can easily hear the target sound. Furthermore, due to the precedence effect, the listener sitting in the rear seat perceives the sound from the direction of the speaker 92R-1 installed in the same direction as the talker sitting in the front seat, which reduces a sense of unnaturalness in the sound image perceived by the listener sitting in the rear seat.

<Variation 1>

Figure 11:
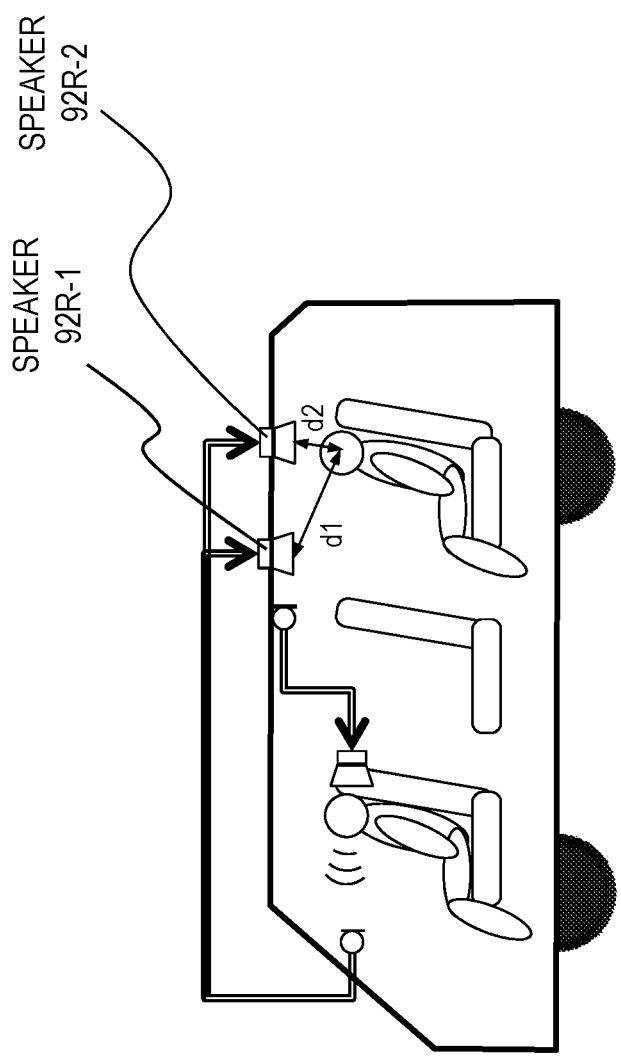
FIG. 11 is a diagram illustrating a positional relationship between speakers and a listener seated in a rear seat, according to Variation 1 on the first embodiment.

Although the present embodiment describes an example in which the speakers are located at headrests, the speakers may be installed in the ceiling or the like of the vehicle, as illustrated in FIG. 11.

<Variation 2>

Figure 12:
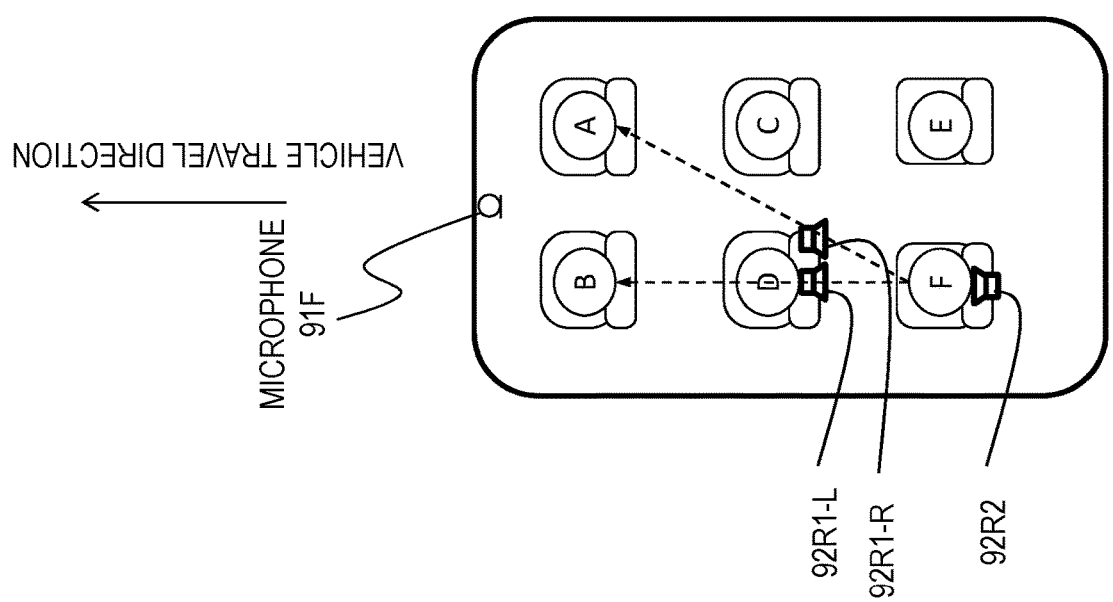
FIG. 12 is a diagram illustrating a positional relationship between speakers and a listener seated in a rear seat, according to Variation 2 on the first embodiment.

Although the present embodiment makes no distinction between the front seats in the first row, i.e., between the right-side seat (the driver's seat) and the left-side seat (the passenger seat), a distinction may be made between the two. For example, from the perspective of a listener sitting in a left-side seat in the third row, a speaker 92R1-R is installed in the same direction as the right-side seat of the first row, and a speaker 92R1-L is installed in the same direction as the left-side seat of the first row, as illustrated in FIG. 12.

In this case, the directional sound collecting unit 110-1-1 takes the sound pickup signal $X_F = [X_{F,1}, \ldots, X_{F,M}]$ as an input; finds, from the sound pickup signal $X_F = [X_{F,1}, \ldots, X_{F,M}]$, an enhanced signal $X'_{FR}$ in which a target sound emitted from the right-side seat of the first row is enhanced, and an enhanced signal $X'_{FL}$ in which a target sound emitted from the left-side seat of the first row is enhanced (using a technique disclosed in Japanese Patent Application Publication No. 2013-179388, for example); and outputs the enhanced signals. The speaker 92R1-R plays back a playback signal $Y_{RR}=[Y_{RR,1}, \ldots, Y_{RR,N}]$ corresponding to a result of multiplying the enhanced signal $X'_{FR}$ by the gain $\alpha_1$. The speaker 92R1-L plays back a playback signal $Y_{RL}=[Y_{RL,1}, \ldots, Y_{RL,N}]$ corresponding to a result of multiplying the enhanced signal $X'_{FL}$ by the gain $\alpha_1$. Furthermore, the speaker 92R-2 plays back a signal obtained by multiplying delayed playback signals $Y'_{RR}$ and $Y'_{RL}$ by the gain $\alpha_2$.

Employing such a configuration makes it possible to even further reduce a sense of unnaturalness in the sound image.

<Variation 3>

Figure 13:
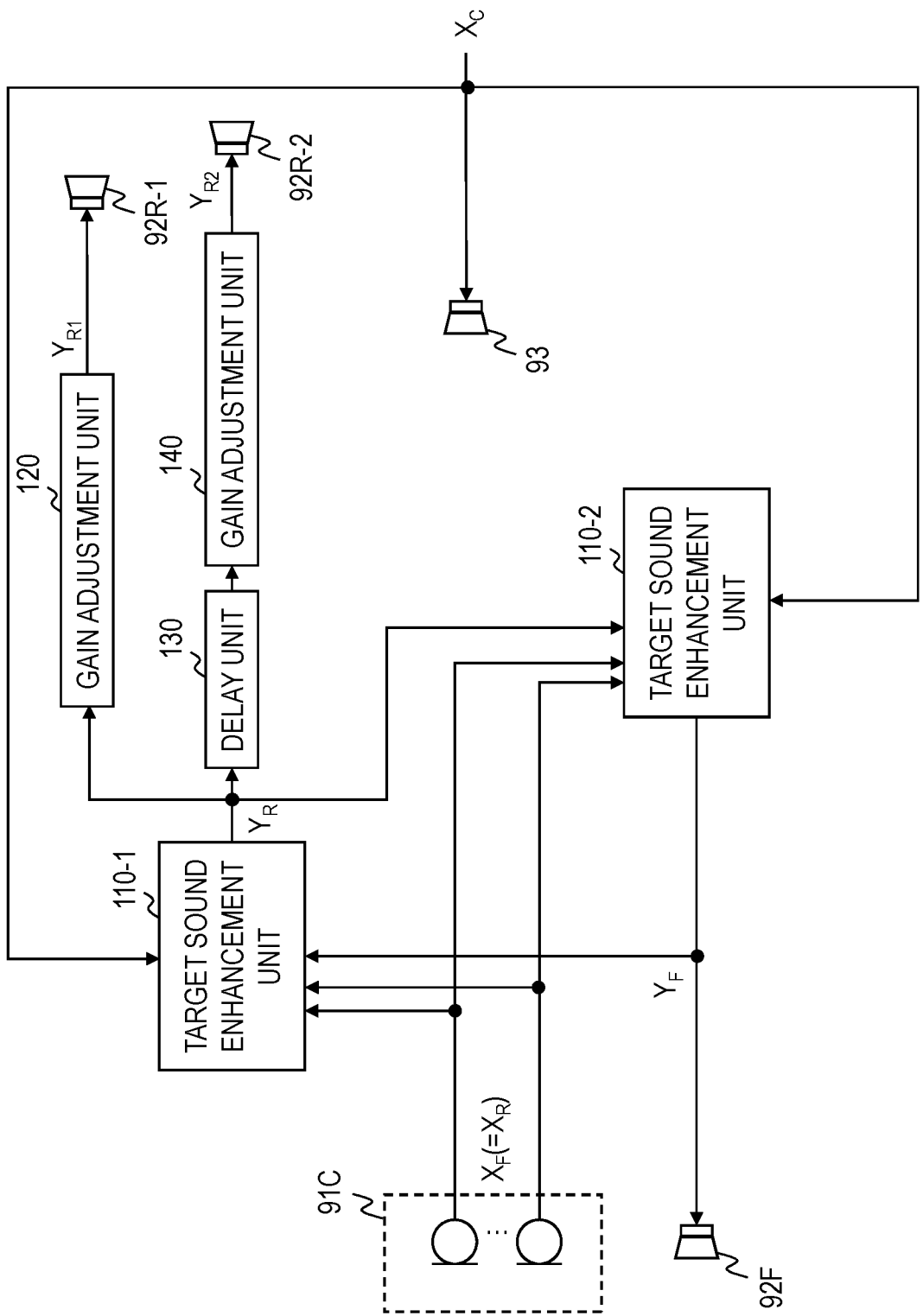
FIG. 13 is a function block diagram illustrating a sound pickup and amplification device according to Variation 3 on the first embodiment.

Although FIG. 3 referred to in the present embodiment illustrates a vehicle with three rows of seats, if there is only enough space to install microphones in two locations, as in a vehicle with two rows of seats or the like, it is conceivable to collect sound from all of the seats by installing a microphone in a single location. In this case, the same processing is carried out by using a microphone 91C, which is a microphone array provided in a single location, as illustrated in FIG. 13.

Other Variations

In the present embodiment, the target sound enhancement units 110-1 and 110-2 are provided. However, if a directional microphone having directionality with respect to the seat from which sound is to be collected is used to obtain an enhanced signal in which the target sound emitted from the seat is enhanced, an output value from the directional microphone may be output to the delay unit 130, the gain adjustment unit 120, and the speaker 92F without using the target sound enhancement units 110-1 and 110-2. Furthermore, an output value from the directional microphone may be output to the echo canceler units 110-1-2 and 110-2-2, without using the directional sound collecting units 110-1-1 and 110-2-1.

The present embodiment describes a configuration having three rows of seats, with microphones and speakers provided in the first row and the third row. This is because with seats in the first row and second row, or seats in the third row and the second row, it is easy for voice to reach those seats, and in-vehicle communication will not be necessary in most cases. However, this does not preclude a configuration in which a microphone and a speaker are installed in the second row, and these may be provided as necessary. Furthermore, the present embodiment is not limited to a vehicle having three rows of seats, and may be applied in a vehicle having two, or four or more, rows of seats as well. In sum, the present embodiment may be applied in cases where people are in a positional relationship where it is difficult for them to hear each others' voices at a typical conversational volume due to travel noise, sounds being played back by the car audio system, other noise from outside the vehicle, and so on, in a common sound field within the vehicle.

Although the present embodiment describes the sound pickup and amplification device as having a configuration that does not include the speakers and microphones, the present invention will be described next as a sound pickup and emitting device which includes a speaker and a microphone. The sound pickup and emitting device is installed in a vehicle. The vehicle is assumed to have two or more sound pickup and amplification positions (e.g., a front seat and a rear seat). The microphone 91F corresponds to the front seat, and is installed in a position at which sound produced by an occupant sitting in the front seat can be collected more easily than sound produced by an occupant sitting in another seat. The speaker 92R-2 corresponds to the rear seat, and is installed in a position where sound reaches an occupant sitting in the rear seat more easily than an occupant sitting in another seat and which is in a direction different from the occupant sitting in the front seat relative to the occupant sitting in the rear seat. The speaker 92R-1 is installed in the direction of the occupant sitting in a front seat relative to the occupant sitting in the rear seat. The speakers 92R-1 and 92R-2 emit sound produced by the occupant sitting in the front seat and collected by the microphone 91F so that the sound emitted from the speaker 92R-1 reaches the ears of the occupant sitting in the rear seat sooner than the sound emitted from the speaker 92R-2.

It can also be said that the sound pickup and amplification device controls the sound played back using the speakers 92R-1 and 92R-2, as will be described below. The sound pickup and amplification device performs control so that an acoustic signal picked up using the microphone 91F is emitted from the speaker 92R-1 installed in the direction of the front seat relative to the rear seat in the vehicle, at a strength which does not produce feedback but which ensures that a user sitting in the rear seat can hear. The sound pickup and amplification device controls the played-back sound so as to satisfy the four conditions described hereinafter. The first is that the sound is played back from a direction different from the direction of the front seat, relative to the rear seat. The second is that the sound is played back so as not to produce feedback from the speaker 92R-2 installed in a position closer to the rear seat than the speaker 92R-1. The third is that the sound is played back at a strength that makes it easy for the user sitting in the rear seat to hear. The fourth is that the emission of the acoustic signal picked up by the microphone 91F is started at a time after the start of sound emission from the speaker 92R-1. Note that "sound collection" means "collecting sound", whereas "picking up" a sound means "receiving a sound with a microphone and collecting the sound as an electrical signal".

Second Embodiment

The following will primarily describe differences from the first embodiment.

Figure 14:
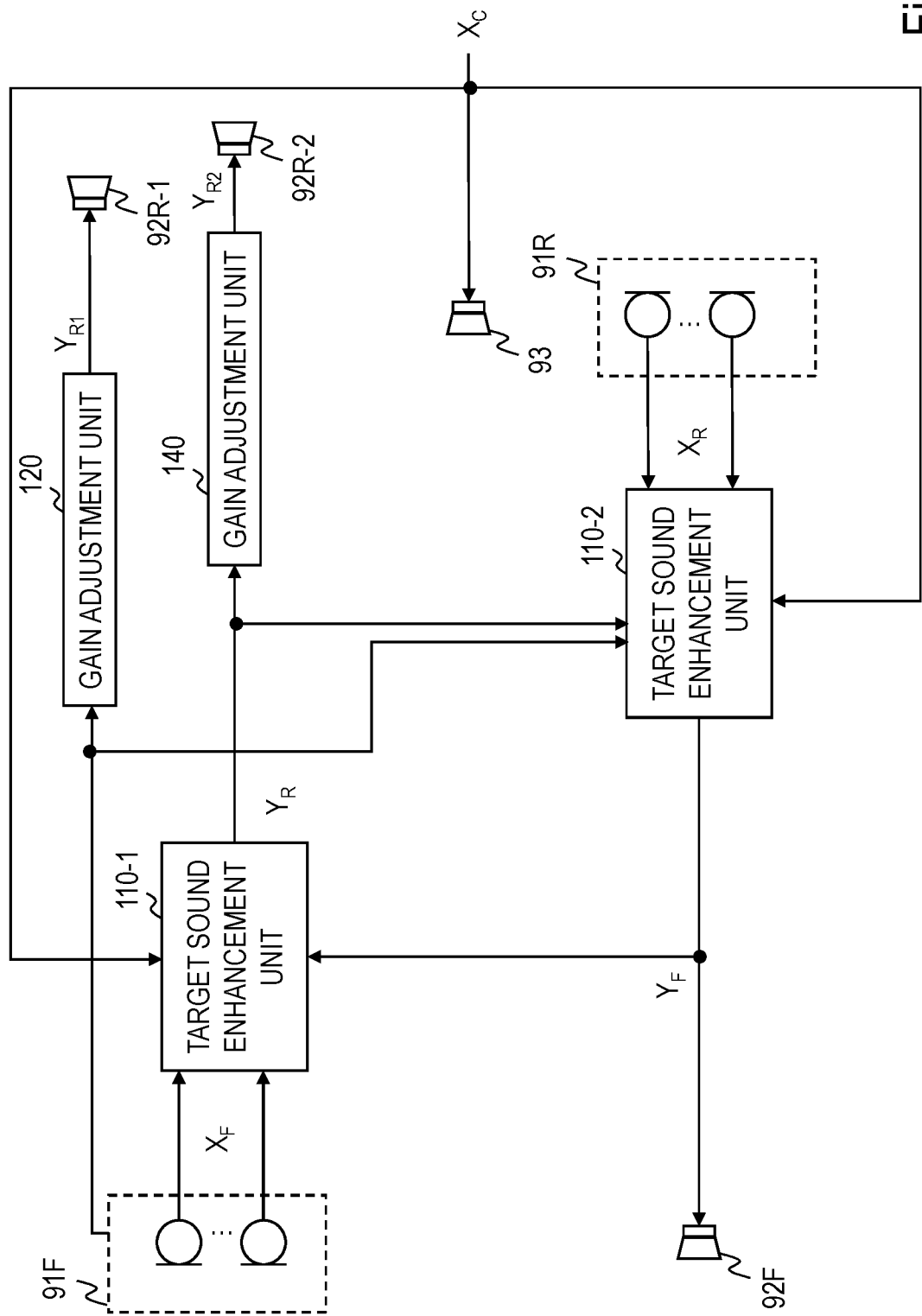
FIG. 14 is a function block diagram illustrating a sound pickup and amplification device according to a second embodiment.
Figure 15:
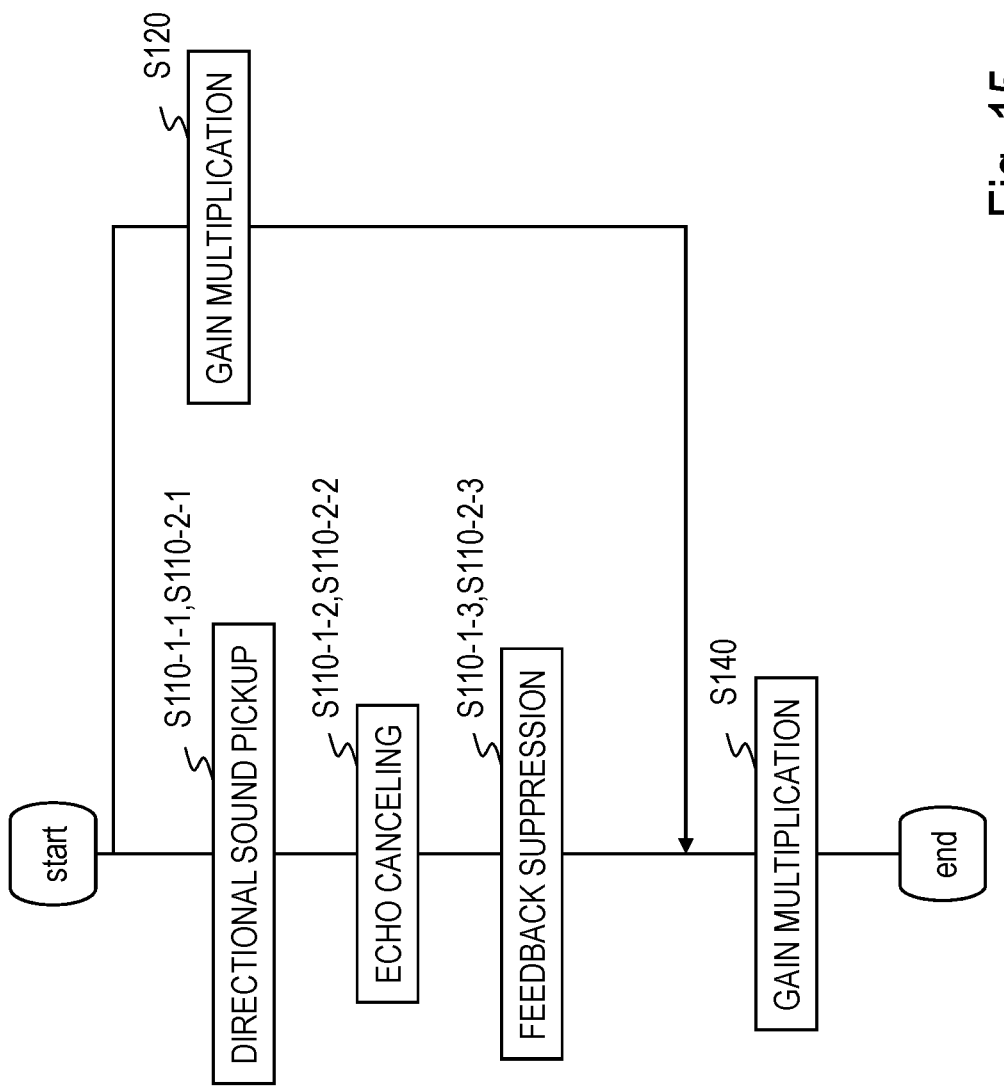
FIG. 15 is a diagram illustrating an example of a flow of processing by the sound pickup and amplification device according to the second embodiment.

FIG. 14 is a function block diagram illustrating a sound pickup and amplification device according to the first embodiment, and FIG. 15 illustrates a processing flow thereof.

The sound pickup and amplification device includes the target sound enhancement units 110-1 and 110-2, and the gain adjustment units 120 and 140. The sound pickup and amplification device according to the present embodiment need not include the delay unit 130.

<Gain Adjustment Unit 120>

The gain adjustment unit 120 takes the sound pickup signal $X_F=[X_{F,1}, \ldots, X_{F,M}]$, rather than the playback signal $Y_R=[Y_{R,1}, \ldots, Y_{R,N}]$, as an input, multiplies that signal by a gain $\alpha_1$ (S120), and outputs the result. The speaker 92R-1 plays back the sound pickup signal $X_F$ multiplied by the gain $\alpha_1$ (=the playback signal $Y_R$).

The target sound enhancement unit 110-1 requires a delay of several ms for signal processing, and thus a delay difference can be imparted between signals that traverse that unit and signals that do not traverse that unit. Furthermore, additional delay is not added as in the first embodiment, and thus the time from when the signal is collected to when the signal is emitted from the speaker 92R-2 can be shorter than in the first embodiment. However, feedback will arise to the extent that the target sound is not emphasized.

<Target Sound Enhancement Unit 110-2>

The target sound enhancement unit 110-2 takes, as inputs, the sound pickup signal $X_R=[X_{R,1}, \ldots, X_{R,M}]$ in which the voice mainly of a talker in the third row has been collected by the microphone 91R, the sound pickup signal $X_F=[X_{F,1}, \ldots, X_{F,M}]$ in which the voice mainly of a talker in the first row has been collected by the microphone 91R, the playback signal $Y_R=[Y_{R,1}, \ldots, Y_{R,N}]$, and the playback signal $X_C=[X_{C,1}, \ldots, X_{C,S}]$; finds the playback signal $Y_F=[Y_{F,1}, \ldots, Y_{F,N}]$, in which the target sound (the sound emitted from the rear seat) has been emphasized, from the sound pickup signal $X_R=[X_{F,1}, \ldots, X_{F,M}]$; and outputs the signal that has been found.

Figure 16:
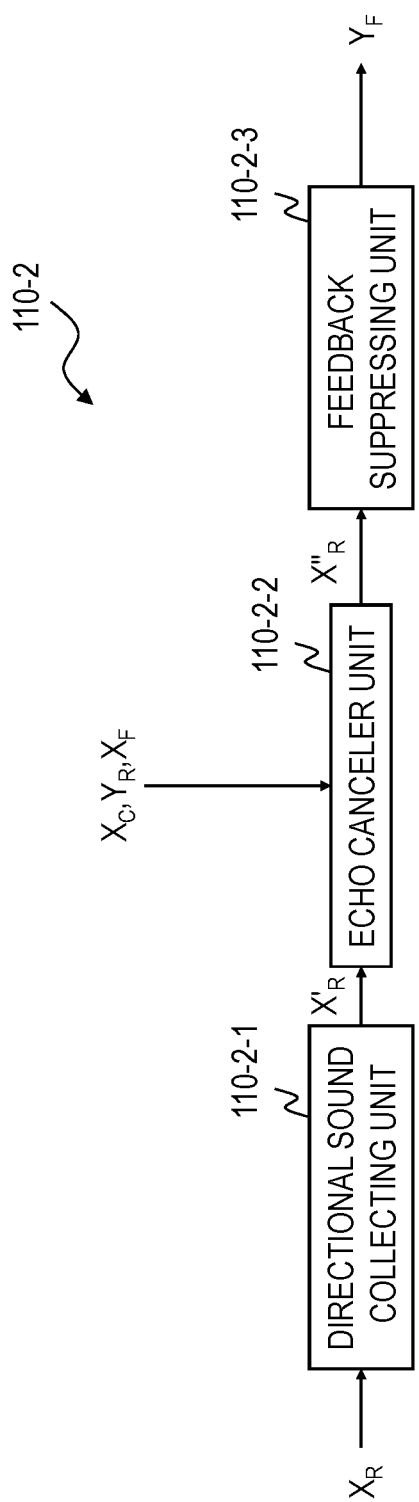
FIG. 16 is a function block diagram illustrating a target sound enhancement unit according to the second embodiment.

FIG. 16 is a function block diagram illustrating the target sound enhancement unit 110-2.

The target sound enhancement unit 110-2 includes a directional sound collecting unit 110-2-1, an echo canceler unit 110-2-2, and a feedback suppressing unit 110-2-3. The processing performed by the directional sound collecting unit 110-2-1 and the feedback suppressing unit 110-2-3 is the same as in the first embodiment and will therefore not be described here.

(Echo Canceler Unit 110-2-2)

The echo canceler unit 110-2-2 takes the enhanced signal $X'_R$, the sound pickup signal $X_F$, the playback signal $Y_R=[Y_{R,1}, \ldots, Y_{R,N}]$, and the playback signal $X_C$ as inputs. Then, by removing a sound component played back by the speaker 93, a sound component played back by the speakers 92R-1 and 92R-2, and so on contained in the enhanced signal $X'_R$, the echo canceler unit 110-2-2 finds an enhanced signal $X''_R$ in which an echo component has been removed (S110-2-2) and outputs that enhanced signal $X''_R$.

Figure 17:
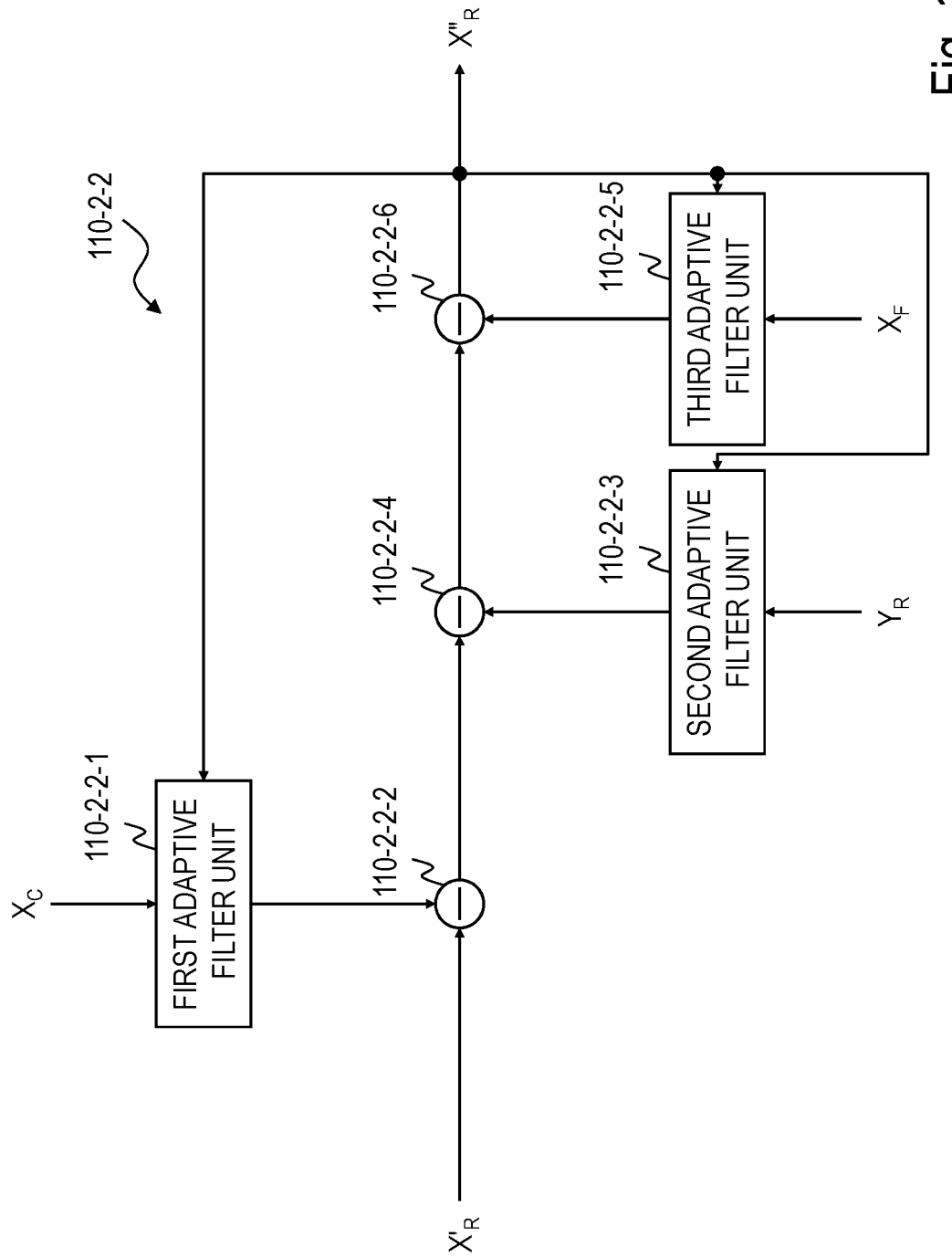
FIG. 17 is a function block diagram illustrating an echo canceler unit according to the second embodiment.

FIG. 17 is a function block diagram illustrating the echo canceler unit 110-2-2.

The echo canceler unit 110-2-2 includes the first adaptive filter unit 110-2-2-1, the first subtracting unit 110-2-2-2, the second adaptive filter unit 110-2-2-3, the second subtracting unit 110-2-2-4, a third adaptive filter unit 110-2-2-5, and a third subtracting unit 110-2-2-6.

The processing performed by the first adaptive filter unit 110-2-2-1, the first subtracting unit 110-2-2-2, the second adaptive filter unit 110-2-2-3, and the second subtracting unit 110-2-2-4 is the same as in the first embodiment.

The third adaptive filter unit 110-2-2-5 takes the sound pickup signal $X_F$ as an input, filters the playback signal $Y_{R2}$ using a third adaptive filter, and generates and outputs a third pseudo-echo $Y'_3$.

The third subtracting unit 110-2-2-6 takes the enhanced signal $X'_{R,2}$ (the output value from the second subtracting unit 110-2-2-4) and the third pseudo-echo $Y'_3$ as inputs, subtracts the third pseudo-echo $Y'_3$ from the enhanced signal $X'_{R,2}$, and obtains and outputs an enhanced signal $X''_R$.

Furthermore, the third adaptive filter unit 110-2-2-5 takes the enhanced signal $X''_R$ as an input, and updates the third adaptive filter using the sound pickup signal $X_F$ and the enhanced signal $X''_R$. Note that the adaptive filters may be updated through the same method as that used for the first adaptive filter unit 110-1-2-1 and the like.

Figure 18:
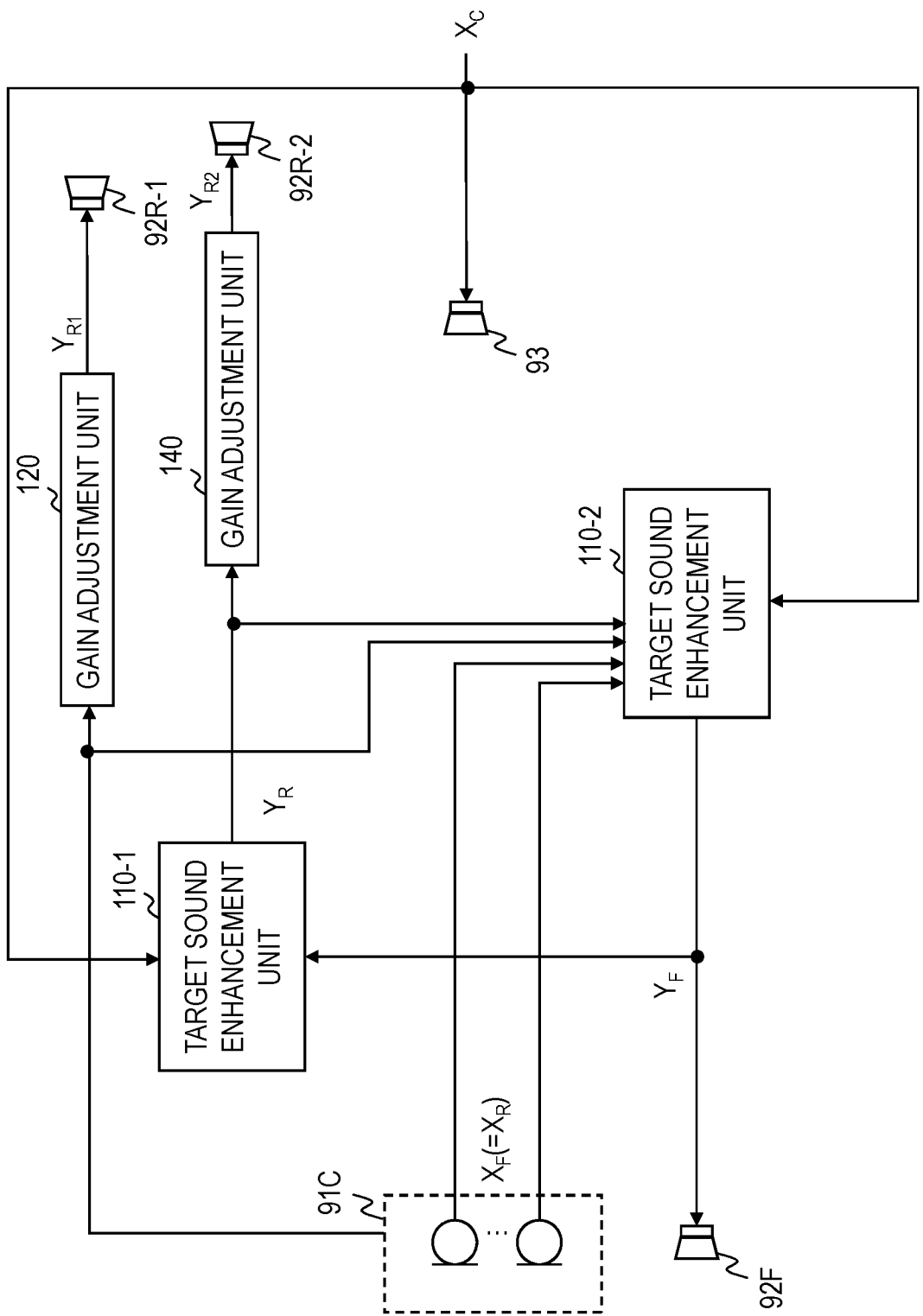
FIG. 18 is a function block diagram illustrating a case where the second embodiment and Variation 3 on the first embodiment have been combined.

Note also that the present embodiment and the variations on the first embodiment may be combined. For example, FIG. 18 is a function block diagram illustrating a case where the present embodiment and Variation 3 on the first embodiment have been combined.

<Other Variations>

The present invention is not intended to be limited to the embodiments and variations described thus far. For example, the various types of processing described above need not be executed in time series as per the descriptions, and may instead be executed in parallel or individually as necessary or in accordance with the processing capabilities of the device executing the processing. Other changes can be made as appropriate within a scope that does not depart from the essential spirit of the present invention.

<Program and Recording Medium>

Additionally, the various processing functions in each device described in the foregoing embodiments and variations may be implemented by a computer. In this case, the processing details of the functions which the apparatus is to have are written in a program. The various processing functions in each device described above are implemented by the computer as a result of the computer executing the program.

The program in which the processing details are written can be recorded into a computer-readable recording medium. Magnetic recording devices, optical discs, magneto-optical recording media, semiconductor memory, and the like are examples of computer-readable recording media.

Additionally, the program is distributed by, for example, selling, transferring, or lending portable recording media such as DVDs and CD-ROMs in which the program is recorded. Furthermore, the program may be distributed by storing the program in a storage device of a server computer and transferring the program from the server computer to another computer over a network.

A computer executing such a program first stores the program recorded on the portable recording medium or the program transferred from the server computer in its own storage unit, for example. Then, when executing the processing, the computer reads the program stored in its own storage unit and executes the processing in accordance with the read program. As another embodiment of this program, the computer may read the program directly from a portable recording medium and execute processing according to the program. Furthermore, each time a program is transferred to the computer from the server computer, processing according to the received programs may be executed sequentially. Additionally, the configuration may be such that the above-described processing is executed by what is known as an ASP (Application Service Provider)-type service that implements the functions of the processing only by instructing execution and obtaining results, without transferring the program from the server computer to the computer in question. Note that the program includes information that is provided for use in processing by an electronic computer and that is based on the program (such as data that is not a direct command to a computer but has a property of defining processing by the computer).

Additionally, although each device is configured by causing a computer to execute a predetermined program, the details of the processing may be at least partially realized by hardware.

The invention claimed is:

1. A sound pickup loudspeaker apparatus to be installed in a vehicle,
   the sound pickup loudspeaker apparatus comprising:
   processing circuitry configured to:
   collect a target sound emitted from a first seat in the vehicle;
   playing back the collected target sound to a listener seated in a second seat in the vehicle from a second sound amplifying device disposed in a direction different from the first seat from the perspective of the listener;

simultaneously play back the collected target sound to the listener from a first sound amplifying device disposed in the same direction as the first seat from the perspective of the listener;

execute a first gain adjustment processing in which the processing circuitry multiplies the target sound by a first gain and outputs the target sound to the first sound amplifying device;

execute delay processing in which the processing circuitry delays the target sound by an amount of time obtained by adding a time for achieving a precedence effect to a delay time of the first sound amplifying device relative to the second sound amplifying device, the delay time being obtained from a positional relationship between the first sound amplifying device, the second sound amplifying device, and the listener; and execute a second gain adjustment processing in which the processing circuitry multiplies the delayed target sound by a second gain and outputs the target sound to the second sound amplifying device, wherein in the first gain adjustment processing the processing circuitry adjusts the first gain to a low value and in the second gain adjustment processing the processing circuitry adjusts the second gain to a high value.

2. A sound pickup loudspeaker apparatus to be installed in a vehicle, the sound pickup loudspeaker apparatus comprising:
processing circuitry configured to:
collect a target sound emitted from a first seat in the vehicle;

playing back the collected target sound to a listener seated in a second seat in the vehicle from a second sound amplifying device disposed in a direction different from the first seat from the perspective of the listener;

simultaneously play back the collected target sound to the listener from a first sound amplifying device disposed in the same direction as the first seat from the perspective of the listener;

execute first gain adjustment processing in which the processing circuitry multiplies the target sound by a first gain and outputs the target sound to the first sound amplifying device;

execute target sound enhancement processing in which the processing circuitry enhances the target sound from a signal collected by one or more microphones; and execute second gain adjustment processing in which the processing circuitry multiplies the enhanced target sound by a second gain and outputs the target sound to the second sound amplifying device, wherein the target sound that is enhanced has delay relative to the target sound that is not enhanced, and in the first gain adjustment processing the processing circuitry adjusts the first gain to a low value and in the second gain adjustment processing the processing circuitry adjusts the second gain to a high value.

3. The sound pickup loudspeaker apparatus according to claim 1 or 2, wherein a target sound for adjustment that is emitted from the first seat in the vehicle is collected, in the first gain adjustment processing the processing circuitry sets, as the first gain, the lower of a minimum gain at which the listener can hear the target sound for adjustment that is played back and a maximum gain of a range that does not produce feedback, and in the second gain adjustment processing the processing circuitry sets, as the second gain, the lower of the minimum gain at which the listener can hear the target sound for adjustment that is played back and the maximum gain of a range that does not produce feedback.

4. The sound pickup loudspeaker apparatus according to claim 3, wherein in the first gain adjustment processing the processing circuitry sets, as the first gain, the lower of (i) a product of the minimum gain at which the listener can hear the target sound for adjustment that is played back and a margin $\beta_{1L}$ for adjusting so that the target sound for adjustment is audible even when noise occurs and (ii) a product of the maximum gain of a range that does not produce feedback and a margin $\beta_{1H}$ for adjusting so that feedback does not occur even when noise occurs, assuming $\beta_{2L} > \beta_{1L}$, in the second gain adjustment processing the processing circuitry sets, as the second gain, the lower of (i) a product of the minimum gain at which the listener can hear the target sound for adjustment that is played back and a margin $\beta_{2L}$ for adjusting so that the target sound for adjustment is audible even when noise occurs and (ii) a product of the maximum gain of a range that does not produce feedback and a margin $\beta_{2H}$ for adjusting so that feedback does not occur even when noise occurs, and the target sound for adjustment is played back from the first sound amplifying device and the second sound amplifying device using the first gain adjusted by the first gain adjustment processing and the second gain adjusted by the second gain adjustment processing, and when feedback occurs, the first gain adjustment processing and the second gain adjustment processing adjust the first gain and the second gain, respectively, using values obtained by multiplying the margins $\beta_{1H}$ and $\beta_{2H}$ by a predetermined value y greater than 0 and less than 1 as new margins $\beta_{1H}$ and $\beta_{2H}$, and repeat the adjustment until the feedback no longer occurs.

5. A sound pickup loudspeaker method using a sound pickup loudspeaker apparatus that includes processing circuitry and is installed in a vehicle, the method comprising:
collecting a target sound emitted from a first seat in the vehicle;

playing back the collected target sound to a listener seated in a second seat in the vehicle from a second sound amplifying device disposed in a direction different from the first seat from the perspective of the listener;

simultaneously playing back the collected target sound to the listener from a first sound amplifying device disposed in the same direction as the first seat from the perspective of the listener:

a first gain adjustment step of the processing circuitry multiplying the target sound by a first gain and outputting the target sound to the first sound amplifying device;

a delay step of the processing circuitry delaying the target sound by an amount of time obtained by adding a time for achieving a precedence effect to a delay time of the first sound amplifying device relative to the second sound amplifying device, the delay time being obtained from a positional relationship between the first sound amplifying device, the second sound amplifying device, and the listener; and a second gain adjustment step of the processing circuitry multiplying the delayed target sound by a second gain and outputs the target sound to the second sound amplifying device, wherein the first gain adjustment step adjusts the first gain to a low value and the second gain adjustment step adjusts the second gain to a high value.

6. A sound pickup loudspeaker method using a sound pickup loudspeaker apparatus that includes processing circuitry and is installed in a vehicle, the method comprising:

collecting a target sound emitted from a first seat in the vehicle;

playing back the collected target sound to a listener seated in a second seat in the vehicle from a second sound amplifying device disposed in a direction different from the first seat from the perspective of the listener;

simultaneously playing back the collected target sound to the listener from a first sound amplifying device disposed in the same direction as the first seat from the perspective of the listener;

a first gain adjustment step of the processing circuitry multiplying the target sound by a first gain and outputting the target sound to the first sound amplifying device;

a target sound enhancement step of the processing circuitry enhancing the target sound from a signal collected by one or more microphones; and a second gain adjustment step of the processing circuitry multiplying the enhanced target sound by a second gain and outputs the target sound to the second sound amplifying device, wherein the target sound that is enhanced has delay relative to the target sound that is not enhanced, and the first gain adjustment step adjusts the first gain to a low value and the second gain adjustment step adjusts the second gain to a high value.

7. A non-transitory computer-readable recording medium on which a program for causing a computer to function as the sound pickup loudspeaker apparatus according to any one of claims 1 to 2.

* * * * *